United States Patent
Choudhary et al.

(10) Patent No.: US 7,381,590 B2
(45) Date of Patent: Jun. 3, 2008

(54) METHOD AND DEVICE INCLUDING REWORKABLE ALPHA PARTICLE BARRIER AND CORROSION BARRIER

(75) Inventors: Rehan Choudhary, Poughkeepsie, NY (US); Benjamin V. Fasano, New Windsor, NY (US); Sushumna Iruvanti, Wappingers Falls, NY (US); Daniel D. Reinhardt, Hinesburg, VT (US); Deborah A. Sylvester, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/308,167

(22) Filed: Mar. 9, 2006

(65) Prior Publication Data
US 2007/0212820 A1 Sep. 13, 2007

(51) Int. Cl.
*H01L 21/00* (2006.01)
*H01L 23/48* (2006.01)

(52) U.S. Cl. ........................ 438/118; 438/119; 257/778; 257/783

(58) Field of Classification Search ................ 438/106, 438/118, 119, 125, 126, 127; 257/687, 778, 257/779, 783, 787
See application file for complete search history.

(56) References Cited

U.S. PATENT DOCUMENTS

| | | | |
|---|---|---|---|
| 4,931,852 A | | 6/1990 | Brown et al. |
| 5,391,915 A | | 2/1995 | Mukai et al. |
| 5,677,246 A | * | 10/1997 | Maeta et al. ................ 438/118 |
| 5,897,336 A | | 4/1999 | Brouillette et al. |
| 5,930,597 A | * | 7/1999 | Call et al. ................... 438/106 |
| 5,998,242 A | * | 12/1999 | Kirkpatrick et al. ........ 438/127 |
| 6,107,123 A | * | 8/2000 | Distefano et al. ........... 438/125 |
| 6,271,107 B1 | * | 8/2001 | Massingill et al. ......... 438/597 |
| 6,417,029 B1 | * | 7/2002 | Fjelstad .................... 438/126 |

* cited by examiner

*Primary Examiner*—Kevin M Picardat
(74) *Attorney, Agent, or Firm*—James J. Cioffi; Greenblum & Bernstein P.L.C.

(57) ABSTRACT

A method and device comprising an easily reworkable alpha particle barrier is provided. The easily reworkable alpha particle barrier is applied in the space between the surface of the chip and the surface of the substrate, and reduces soft error rate (SER). Further, the easily reworkable alpha particle barrier material is chosen from the group of an organic material, a hydrocarbon, more specifically a polyalphaolefin (PAO) oil, and a polymer or filled polymer; wherein the polyalphaolefin oil has a viscosity below 1000 cSt (at 100° C.). The easily reworkable alpha particle barrier material can be used with multichip modules (MCM's) allowing easy device rework of one or more dies without affecting other dies on the same substrate.

15 Claims, 1 Drawing Sheet

1

METHOD AND DEVICE INCLUDING REWORKABLE ALPHA PARTICLE BARRIER AND CORROSION BARRIER

FIELD OF THE INVENTION

The invention relates generally to an easily reworkable alpha particle barrier and C4 corrosion barrier. In some aspects the invention also relates to a method of minimizing soft error rate (SER) of electronic devices while allowing simple chip rework.

BACKGROUND OF THE INVENTION

Electronic components utilizing integrated circuit chips are used in a number of applications. Controlled Collapse Chip Connection (C4 or "flip chip") is an interconnect technology developed by IBM that provides a large chip to package I/O capability. Typically, one or more integrated circuit chips are mounted above a single or multiple layer substrate and pads on the chip are electrically connected to corresponding pads on the substrate by a plurality of electrical connections such as solder bumps.

The die-attached flip chip package typically includes a gap or space between the integrated circuit chip and the substrate resulting from the overall height of the solder bump connection between the chip and the substrate or adjacent carrier. The substrate material and/or the interconnect solder can emit alpha particles. Alpha particle emissions result from the radioactive decay of impurity elements such as polonium, thorium and uranium in the substrate or the interconnect solder. The alpha particles can cause changes in both logic and memory functions of the device in close proximity to the alpha particle source. Such a disruption of the normal operation of the semiconductor devices is commonly referred to as a soft error upset (SEU) and the overall contribution to the performance of the device is described as the soft error rate (SER).

The C4 joints are susceptible to cyclic fatigue cracking due to the expansion mis-match between the chip and the underlying substrate, or carrier. In order to improve the reliability of the solder joints under cyclic field operating conditions of the package (on/off), the gap is often filled with an underfill material. The underfill material is often a particle-filled epoxy compound that enhances the fatigue life of the C4. The underfill material also helps to absorb the alpha particle radiation. The fillers in the epoxy underfills should be of high purity to assure that the underfill itself is not a source of alpha particles.

There are, however, packages that do not contain the traditional epoxy underfill and hence are susceptible to SER. These packages are typically large multi chip modules (MCMs) that require chip reworkabilty for upgrades or defective chip replacement. Removing the hardened, or cured underfill (such as the conventional epoxy underfills) for chip rework is complicated, if not impractical. There are also other packages which do not contain the epoxy underfill such as those that do not suffer from the expansion mis-match between the chip and the carrier, or those that are not subjected to large cyclic temperature excursions in field operation.

Earlier MCM packages contained thin film technology, a thin film of metal and/or a polymer such as a polyimide on the substrate, which provided the unintended benefit of absorbing the alpha radiation from the substrate. However, thin film technology tends to be very expensive. As described earlier, the use of hardened, or cured epoxy underfill makes device rework extremely difficult and economically unfeasible. Therefore, there is a need to provide an effective alpha particle barrier that is easily reworkable and cost efficient, and which minimizes or eliminates SER.

SUMMARY OF THE INVENTION

In a first aspect, the invention provides a method of protecting electronic circuits. The method comprises providing at least one integrated circuit (IC) chip electrically connected to a corresponding pad on a substrate. The method further includes providing an easily reworkable alpha blocking material in a gap between the IC chip and the substrate on at least one side of the gap, an IC chip side or a substrate side.

In a second aspect, the invention provides a method for making an easily reworkable integrated circuit chip electronic device comprising providing a flip chip assembly comprising at least one chip electrically connected to corresponding pads on a substrate by a plurality of connections between the at least one chip and the substrate. There is a gap between the surface of the flip chip and the surface of the substrate. The method further includes partially or fully filling the gap with an easily reworkable alpha blocking material selected from one or more of an organic material, a hydrocarbon oil or an oil-filler mixture/suspension, and a polymer or filled polymer by dispensing the material on at least one side of the gap between the chip and the substrate.

A third aspect of the invention is a flip chip device which comprises an alpha particle barrier material selected from the group of an organic material, a PAO oil, a polymer, and a filled polymer. The alpha particle barrier material is easily reworkable and has a viscosity less than 1000 cSt at 100° C.

DESCRIPTION OF EMBODIMENTS OF THE INVENTION

The invention relates to a method and/or device comprising an easily reworkable alpha particle barrier layer which can also act as a C4 corrosion barrier. More particularly, the invention provides a device and method which includes an effective alpha particle barrier layer that is easily reworkable and which minimizes or eliminates SER. The invention is particularly advantageous when used with multichip modules (MCM's) as it allows easy device rework of one or more dies without affecting other dies on the same substrate. The alpha particle barrier of the invention additionally acts as a corrosion barrier, effectively keeping moisture away from the package interconnect components.

Figure 1:
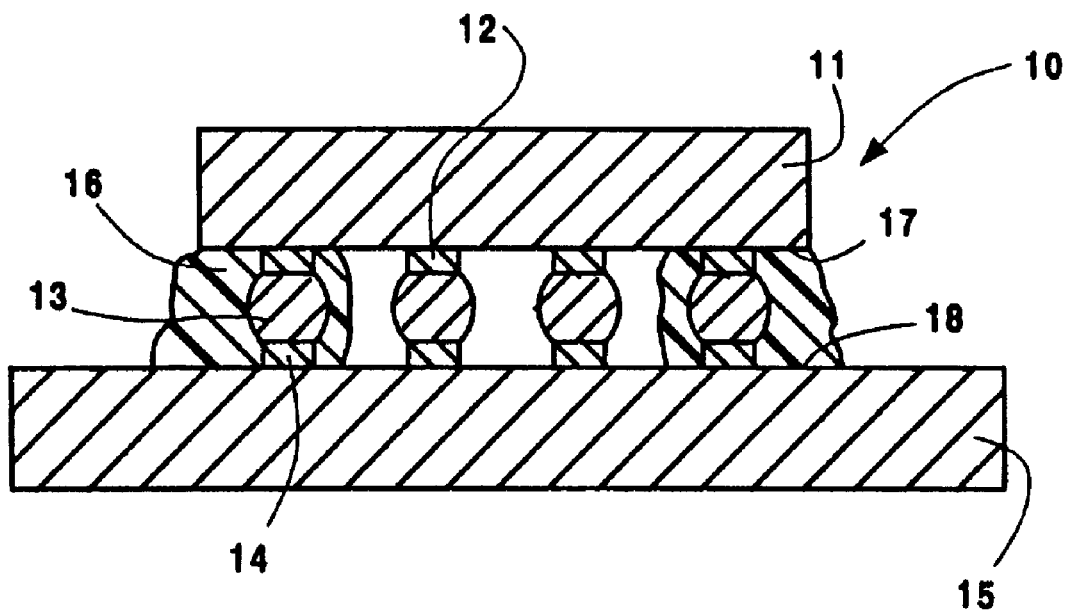
FIGS. 1-2 depict a device in accordance with the invention.

Referring to FIG. 1, a cross-section is shown of an electronic component 10 comprising an integrated circuit chip 11 and an interconnecting substrate 15. Integrated circuit chip 11 is shown having conductive pads 12 electrically connected to conductive pads 14 by solder connections 13 such as solder bumps, in a method known as C4 or flip chip packaging. The lower surface of substrate 15 may contain connectors (not shown), for connection of the substrate 15 to another electronic device such as a circuit board.

Figure 2:
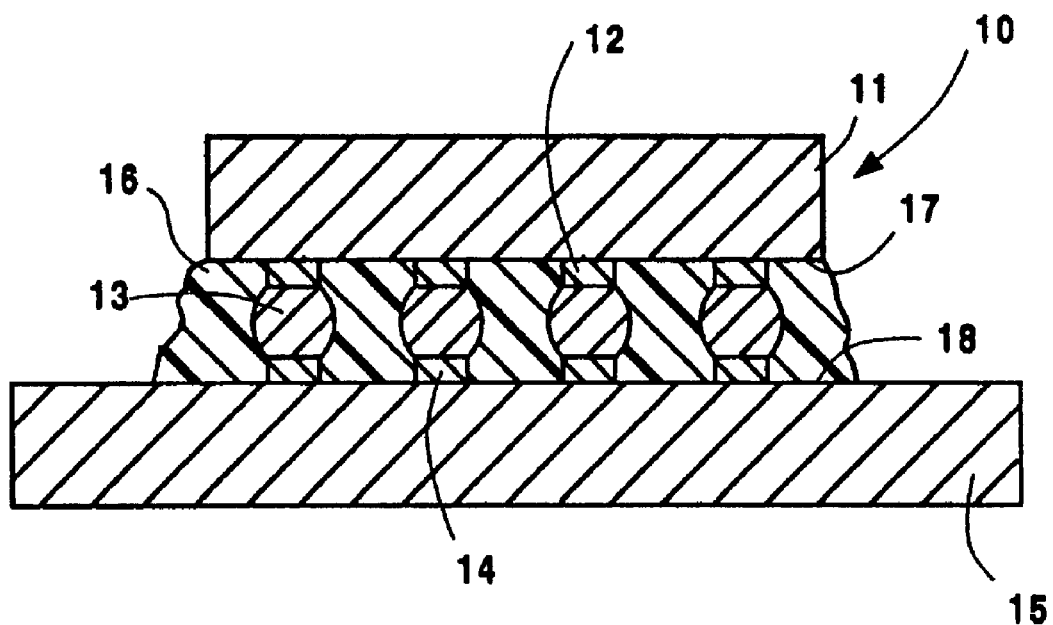

Electronic component 10 is shown in FIG. 1 as having an easily reworkable alpha particle barrier layer 16 between pad containing surface 17 of integrated circuit chip 11 and pad containing surface 18 of substrate 15. The peripheral solder connections 13 and pads 12 and 14 are shown as encapsulated by the easily reworkable alpha particle barrier layer 16. In FIG. 2, the easily reworkable alpha particle barrier layer 16 is shown as completely encapsulating all of the solder connections 13.

Integrated circuit chip 11 may be any of a number of integrated circuit devices such as a passive device or a very large scale integration (VLSI) or ultra large scale integration (ULSI) active device. Further, there may be at least one integrated circuit chip present on substrate 15.

In a first embodiment, the reworkable alpha particle barrier material comprises a low molecular weight oligomer/polymer, such as a high viscosity grade hydrocarbon oil, for example, polyalphaolefin (PAO) oil.

Examples of oils suitable as an easily reworkable alpha particle barrier material in the first embodiment of the invention may include high viscosity grade oils, such as PAO 100 cSt (Mobil SHF 1003), 150, 300 or 1000 cSt (Spectrasyn® grades from Exxon Mobil). The viscosity values correspond to those measured at 100° C. These oils are not expected to interfere with thermal interface materials (TIM) such as thermal paste, gels, pads, solder, etc. if any, present on the substrate and/or chip. Any oil, or low molecular weight oligomer/polymer is suitable for the invention, provided that it performs the function of an alpha particle barrier and can be easily removed with solvent cleaning or other means (such as heating) for chip rework. Furthermore, although oils are contemplated, any organic compound which acts as an effective alpha particle barrier and which can be easily removed with suitable solvent cleaning or other means can be used in the present invention. Examples are gels, low molecular weight thermoplastics, acrylates, coatings such as Parylene, etc.

Ideally, the material is selected so as to withstand chip joining and operational temperatures, yet still allow device reworking using conventional cleaning tools and methods. More practically, the material is selected so as to withstand package second-level attach to cards/boards, yet still allow chip rework using conventional cleaning tools and methods. In oil embodiments, the viscosity at 100° C. is below 1000 cSt, preferably below 300 cSt, and in further embodiments below about 150 cSt.

Chip rework when using PAO oil or any suitable organic compound as the reworkable alpha particle barrier, can be performed for example, by washing with xylene, rinsing with a cleaning solvent such as isopropanol (IPA), and then drying with nitrogen. Additional suitable cleaning solvents include polar and non-polar fluids, protic and aprotic fluids, including N-methylpyrolidone (NMP), acetone, common aldehydes, ketones, tetrahydrofuran, hexafluoroisopropanol (HFIP), and gamma-butyrolactone. However, any conventional cleaning tool, solvent, or method can be used to perform device reworking of the first embodiment of the present invention.

It has been found that the first embodiment of the invention is also capable of acting as a C4 corrosion barrier. For example, use of neat PAO oil or a mixture of PAO oil and suitable anti-oxidants such as Irganox® 1010 (antioxidant obtained from Ciba Specialty Chemicals) individually or in combination with other anti-oxidants can yield increased corrosion protection in hermetically, semi-hermetically and non-hermetically sealed packages. Although the exact mechanism is not fully understood, it is believed that a hydrophobic layer coats the package components such as the solder interconnect, keeping moisture away and thereby minimizing or preventing corrosion in semi- and non-hermetic environments. Oil-solid filler compositions such as slurries and low-viscosity compounds (such as thermal paste/grease) can also be used as an alpha particle barrier layer. These materials will provide the additional benefit of better compatibility when used with thermal paste/grease type TIMs.

In a second embodiment, the reworkable alpha particle barrier layer comprises a polymer, or polymer/filler mixture or suspension. Examples of polymers and compounds suitable as a reworkable alpha particle barrier layers in the second embodiment are low molecular weight thermoplastics, such as polysulfone, polyisobutylene, acrylates, polystyrene, polyamides, etc. Other polymers such as reworkable engineered thermoplastics (for example Cookson Staystik® polymers available from Cookson Electronics), poly ethyl ether ketones (for example OXPEKK® obtained from Oxford Performance Materials, Inc.), and polyetherimide (for example available as a polymer or filled polymer from GE Micronized Polymers) may also be used. Suitable polymers will have a glass transition temperature ($T_g$) between about −65° C. and 230° C. and can be used neat or in combination with one another.

Optionally, the polymers such as those noted above may be filled with a ceramic or metal powder in a mixture or suspension. Fillers are typically used to increase the thermal conductivity and/or viscosity of the polymer and reduce the coefficient of thermal expansion. Fillers can also function to block alpha particle emissions from the package components and/or change the dielectric properties of the alpha particle barrier material. Examples of suitable fillers include metals such as aluminum, nickel, copper, indium, boron, tin, and silver optionally with insulating polymer or oxide coatings. Additionally, if a metal powder is selected, it will ideally have electrically insulative properties or be coated to be electrically non-conducting to reduce C4-C4 shorting. Suitable coatings for the metal powder filler include an organic layer, for example thermoplastic or thermoset organics such as polyamides/polyimides, or oxides such as barium titanate, $Al_2O_3$ or $SiO_2$. Other examples of suitable fillers include carbon, ceramic oxides such as $Al_2O_3$, $SiO_2$, SiC, $SnO_2$, BN, AlN and diamond. The above noted fillers can be used alone or in combination with each other. Although any amount of filler is contemplated by the present invention, it is preferable to use less than 90% filler by weight in a polymer/filler mixture or suspension. In embodiments, the amount of filler, if any, is selected depending on the desired viscosity of the alpha particle barrier layer so as to enable full or partial gap filling between the substrate and device and/or retention of the layer between the substrate and die during operational temperatures.

Optionally, a solvent may be added to the neat polymer or polymer/filler mixture or suspension as a temporary carrier to lower the viscosity of the barrier material and aid in application to the substrate-device gap. Any solvent is suitable provided that the solvent does not substantially deleteriously affect the alpha blocking or dielectric properties of the barrier during use and it is safe for handling and disposal. After application of the reworkable alpha particle barrier the solvent can be removed by evaporation at room temperature or by heating at elevated temperatures, or by any other conventional method. Examples of viscosity-lowering solvents include one or more organic solvents selected from the group of paraffins (such as heptane, octane), alcohols (ethyl, isopropyl), ethers, esters, amides, lactones, ketones, and aromatic hydrocarbons. Some typical examples include N-methyl-pyrrolidone (NMP), diglyme, triglyme, xylene, amyl acetate, and acetophenone.

The polymer and optional fillers are selected so as to withstand package $2^{nd}$ level attach to a printed circuit board/card and operational temperatures, yet still allow chip rework using conventional cleaning tools and methods. Chip rework when using a neat or filled polymer as the reworkable alpha particle barrier can be performed, for example, by washing with, for example, xylene, rinsing with a cleaning solvent such as isopropanol (IPA), and then drying with nitrogen. Additional suitable cleaning solvents include polar and non-polar fluids, protic and aprotic fluids, including N-methylpyrolidone, acetone, common aldehydes, ketones, tetrahydrofuran, HFIP and gamma-butyrolactone. It should be noted that any conventional cleaning tool, cleaning solvent, or method can be used to perform device reworking of the second embodiment of the present invention.

The physical state of easily reworkable alpha particle barrier material of a second embodiment of the invention is ideally in the B-stage, that is, in an intermediate stage in the polymerization process and not completely cured. Such a state allows easy reworking of the die with only conventional cleaning techniques, and optionally heating. However, presence of the material in the B-stage is not required. Alternatively, the easily reworkable alpha particle barrier material can be a polymer or filled polymer. The invention contemplates the reworkable alpha particle barrier material to be in any stage, provided that it is easily reworked with only conventional cleaning techniques, and optionally heating.

Generally, the reworkable alpha particle barrier material is manually, or with an auto-dispense tool, dispensed on at least on side of a gap between the chip and substrate to partially or fully fill the C4 cage. Optionally, the substrate, or the material, or both may be treated to reduce the viscosity and aid the flow of the alpha particle blocking material, such as by way of heating, low frequency vibration, ultrasonic vibration, or combinations thereof. Techniques such as heating facilitate the flow of the material into the area between the substrate and the device (C4 cage). Ideally, the material is drawn into the C4 cage by capillary action, and the material is expected to remain in the C4 cage by way of surface tension.

Additionally, containment methods to retain the reworkable alpha particle barrier material in the gap between the chip and substrate can also be included. For example, o-rings or meshes may be used to minimize flow out from under the die region and/or to provide dam formation to retain thickness of the material and provide containment for adjacent component isolation. The barrier material is at least substantially contained in the gap between the surface of the chip and the surface of the substrate, for example, after application at least a portion of the material remains between both the chip and the substrate, although simultaneous contact with both the chip and substrate are not required.

EXAMPLE 1

A PAO oil alpha blocking material (SpectraSyn® Ultra 300) with a viscosity of about 300 cSt (at 100° C.) was dispensed with a syringe around the perimeter of chip(s) connected by C4 connections to a substrate. Capillary action drew the material under the chip and around the C4 connections, wherein the spacing between the die BLM (bond limiting metallurgy) and substrate TSM (top surface metallurgy) are between about 70 and 100 μm.

The chip(s) were then tested to ensure proper connection to the substrate. The chip(s) can easily be removed if faulty connections are found by washing the dispensed area with xylene, rinsing with isopropanol and then drying with nitrogen. Although not required, the chip and substrate and/or the oil can be heated to 60-85° C. to lower the material viscosity and facilitate the flow of the material into the C4 cage. The alpha barrier effectiveness of the oil was demonstrated by first measuring the alpha particle count off an MCM ceramic surface and comparing it to the count from the same substrate surface coated with a thin layer of oil as shown in table below.

| Sample | Alpha Counts (background subtracted)/$Cm^2$/Kh |
|---|---|
| Baseline (Ceramic Substrate 1) | 63.8 ± 7.8 |
| Substrate 1 coated with PAO-100 oil | 2.1 ± 5.2 |
| Baseline (Ceramic substrate 2) | 49 ± 7.9 |
| Substrate 2 coated with PAO-150 (SpectraSyn® 150) oil | 4.3 ± 5.4 |
| PAO oils on Si wafer: | |
| SpectraSyn® 150 | 3.4 ± 2.3 |
| SpectraSyn® 300 | 2.8 ± 3.5 |
| SpectraSyn® 1000 | 4.8 ± 5.5 |

EXAMPLE 2

A low molecular weight thermoplastic polymer alpha blocking material polyisobutylene, was dispensed with a syringe around the perimeter of chip(s) connected by C4 connections to a substrate. The chip-joined substrate and the polymer were heated to about 85° C. to lower the viscosity of the polymer and improve its flow. Capillary action drew the material under the chip and around the C4 connections, wherein the spacing between the die BLM (bond limiting metallurgy) and substrate TSM (top surface metallurgy) are between about 70 and 100 μm.

The chip(s) were then tested to ensure proper connection to the substrate. The chip(s) can easily be removed if faulty connections are found by washing the dispensed area with xylene, rinsing with isopropanol and then drying with nitrogen.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

What is claimed is:

1. A method of protecting electronic circuits comprising:
   providing at least one integrated circuit (IC) chip electrically connected to a corresponding pad on a substrate; and
   providing an easily reworkable alpha blocking material in a gap between the IC chip and the substrate on at least one side of the gap, an IC chip side or a substrate side, wherein the easily reworkable alpha blocking material has a viscosity less than 1000 cSt at 100° C.

2. The method of claim 1, wherein the easily reworkable alpha blocking material is selected from one or more of a hydrocarbon oil, and a thermoplastic polymer.

3. The method of claim 1 wherein the easily reworkable alpha blocking material comprises a suspension and/or a mixture of oil and inorganic filler, or a filled-polymer.

4. The method of claim 1, wherein the easily reworkable alpha blocking material further includes a viscosity-lowering solvent selected from at least one of paraffins, alcohols, ethers, esters, amides, lactones, ketones, sulfones, aromatic hydrocarbons, N-methyl-pyrrolidone (NMP), diglyme, triglyme, xylene, amyl acetate, and acetophenone.

5. The method of claim 1, wherein the easily reworkable alpha blocking material is easily removed by washing with a cleaning solvent and optionally dried with nitrogen.

6. The method of claim 1, wherein the easily reworkable alpha blocking material is drawn into a gap between the surface of the IC chip and a facing surface of the substrate by one or more of capillary action, heating, and vibration, and wherein the easily reworkable alpha blocking material is at least substantially contained in the gap between a surface of the IC chip and a facing surface of the substrate by at least one of o-rings, meshes, and surface tension.

7. The method of claim 2, wherein the hydrocarbon oil comprises a polyalpha olefin.

8. The method of claim 2, wherein the thermoplastic polymer comprises a polymer selected from at least one of polyisobutylene, polystyrene, acrylates, poly ethyl ether ketones, polyetherimide, polyamides, and engineered thermoplastics, wherein the polymer has a glass transition temperature ($T_g$) between about −65° C. and 230° C.

9. The method of claim 3, wherein the filled-polymer, suspension and/or mixture comprises a metal powder filler selected from at least one of carbon, $Al_2O_3$, $SiO_2$, $SnO_2$, BN, AlN, SiC diamond, aluminum, nickel, copper, indium, boron, tin, and silver, wherein said metal filler can optionally be coated with an organic layer, polymides, barium titanate, $Al_2O_3$ or $SiO_2$.

10. A method for making an easily reworkable integrated circuit chip electronic device comprising:
provising a flip chip assembly comprising at least one chip electrically connected to corresponding pad on a substrate by a plurality of connections between the at least one chip and the substrate, there being a gap between the surface of the flip chip and the surface of the substrate;
partially or fully filling the gap with an easily reworkable alpha blocking material selected from one or more of an organic material, a hydrocarbon oil or an oil-filler mixture/suspension and a polymer or filled-polymer by dispensing the material on at least one side of the gap between the chip and the substrate; and
treating the easily reworkable alpha blocking material to reduce viscosity to less than 1000 cSt at 100° C.

11. A method for making an easily reworkable integrated circuit chip electronic device comprising:
providing a flip chip assembly comprising at least one chip electrically connected to corresponding pad on a substrate by a plurality of connections between the at least one chip and the substrate, there being a gap between the surface of the flip chip and the surface of the substrate;
partially or fully filling the gap with an easily reworkable alpha blocking material selected from one or more of an organic material, a hydrocarbon oil or an oil-filler mixture/suspension and a polymer or filled-polymer by dispensing the material on at least one side of the gap between the chip and the substrate; and
treating the easily reworkable aloha blocking material to reduce viscosity to less than 1000 cSt at 100° C.,
wherein the easily reworkable alpha blocking material is at least substantially contained in a opening between the surface of the chip and the surface of the substrate by o-rings or meshes.

12. The method of claim 10, wherein the easily reworkable alpha blocking material is drawn into the gap between the surface of the chip and the surface of the substrate by a method selected from at least one of capillary action, heating, and vibration; and wherein the easily reworkable material remains in the opening between the surface of the chip and the surface of the substrate by surface tension.

13. The method of claim 10, wherein the polymer or filled-polymer comprises at least one polymer selected from the group consisting of poly ethyl ether ketones, polyetherimide, and engineered thermoplastics, wherein the polymer or filled-polymer has a glass transition temperature ($T_g$) between about −65° C. and 230° C.

14. The method of claim 10, wherein the filled-polymer or mixture/suspension comprises a metal powder filler selected from at least one of carbon, $Al_2O_3$, $SiO_2$, $SnO_2$, BN, AlN, SiC, diamond, aluminum, nickel, copper, indium, boron, tin, and silver wherein said filler can optionally be coated with polymides, barium titanate, $Al_2O_3$ or $SiO_2$.

15. The method of claim 10, wherein the easily reworkable alpha blocking material further includes a viscosity lowering solvent selected from at least one of paraffins, alcohols, ethers, esters, amides, lactones, ketones, sulfones, aromatic hydrocarbons, N-methyl-pyrrolidone (NMP), diglyme, triglyme, xylene, amyl acetate, and acetophenone.

* * * * *